(12) United States Patent
Khlat

(10) Patent No.: US 12,231,088 B2
(45) Date of Patent: Feb. 18, 2025

(54) WIDEBAND TRANSMISSION CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 132 days.

(21) Appl. No.: 17/689,232

(22) Filed: Mar. 8, 2022

(65) Prior Publication Data

US 2022/0407462 A1    Dec. 22, 2022

Related U.S. Application Data

(60) Provisional application No. 63/212,453, filed on Jun. 18, 2021.

(51) Int. Cl.
*H03F 1/02* (2006.01)
*H03F 3/24* (2006.01)
*H04B 1/04* (2006.01)

(52) U.S. Cl.
CPC ........... *H03F 1/0233* (2013.01); *H03F 3/245* (2013.01); *H04B 1/04* (2013.01);
(Continued)

(58) Field of Classification Search
CPC . H04B 1/04; H04B 2001/0425; H03F 1/0233; H03F 2200/451; H03F 2201/105; H03F 3/245
(Continued)

(56) References Cited

U.S. PATENT DOCUMENTS

| | | |
|---|---|---|
| 4,797,898 A | 1/1989 | Martinez |
| 5,793,821 A | 8/1998 | Norrell et al. |
| | (Continued) | |

FOREIGN PATENT DOCUMENTS

| | | |
|---|---|---|
| CN | 105812073 A | 7/2016 |
| CN | 110798155 A | 2/2020 |
| | (Continued) | |

OTHER PUBLICATIONS

U.S. Appl. No. 17/700,700 (Year: 2021).*
(Continued)

*Primary Examiner* — Kevin M Burd
(74) *Attorney, Agent, or Firm* — Withrow & Terranova, P.L.L.C.

(57) ABSTRACT

A wideband transmission circuit is provided. The wideband transmission circuit includes a power amplifier circuit(s) and an envelope tracking (ET) integrated circuit (ETIC). The ETIC is configured to generate a modulated voltage based on a modulated target voltage. The power amplifier circuit(s) amplifies a radio frequency (RF) signal(s) based on the modulated voltage and provides the amplified RF signal(s) to a coupled RF front-end circuit. In embodiments disclosed herein, the ETIC is configured to cause the modulated target voltage to be equalized by a real equalization filter to thereby compensate for a complex voltage distortion filter resulting from a coupling between the power amplifier circuit(s) and the RF front-end circuit. As a result, it is possible to reduce undesired instantaneous excessive compression and/or spectrum regrowth resulting from the complex voltage distortion filter to thereby improve efficiency and linearity of the power amplifier circuit(s).

18 Claims, 12 Drawing Sheets

(52) U.S. Cl.
CPC .. *H03F 2200/105* (2013.01); *H03F 2200/451* (2013.01); *H04B 2001/0425* (2013.01)

(58) Field of Classification Search
USPC .................................................... 375/297
See application file for complete search history.

(56) References Cited

U.S. PATENT DOCUMENTS

| | | | |
|---|---|---|---|
| 6,760,451 | B1 | 7/2004 | Craven et al. |
| 7,663,436 | B2 | 2/2010 | Takano et al. |
| 7,683,713 | B2 | 3/2010 | Hongo |
| 7,859,338 | B2 | 12/2010 | Bajdechi et al. |
| 8,605,819 | B2 | 12/2013 | Lozhkin |
| 8,749,309 | B2 | 6/2014 | Ho et al. |
| 9,036,734 | B1 | 5/2015 | Mauer et al. |
| 9,065,504 | B2 | 6/2015 | Kwon et al. |
| 9,112,413 | B2 | 8/2015 | Barth et al. |
| 9,356,760 | B2 | 5/2016 | Larsson et al. |
| 9,438,196 | B2 | 9/2016 | Smith et al. |
| 9,560,595 | B2 | 1/2017 | Dakshinamurthy et al. |
| 9,692,366 | B2 | 6/2017 | Pilgram |
| 10,177,719 | B2 | 1/2019 | Gazneli et al. |
| 10,305,435 | B1 | 5/2019 | Murugesu et al. |
| 10,326,408 | B2 | 6/2019 | Khlat et al. |
| 10,361,744 | B1 * | 7/2019 | Khlat .................... H04B 17/13 |
| 11,088,660 | B2 | 8/2021 | Lin et al. |
| 11,387,789 | B2 | 7/2022 | Khlat et al. |
| 11,424,719 | B2 | 8/2022 | Khlat |
| 11,569,783 | B2 | 1/2023 | Nomiyama et al. |
| 11,637,531 | B1 | 4/2023 | Perreault et al. |
| 2001/0054974 | A1 | 12/2001 | Wright |
| 2002/0190811 | A1 | 12/2002 | Sperber |
| 2003/0042979 | A1 | 3/2003 | Gurvich et al. |
| 2004/0239446 | A1 | 12/2004 | Gurvich et al. |
| 2005/0100105 | A1 | 5/2005 | Jensen |
| 2005/0254659 | A1 | 11/2005 | Heinsen |
| 2006/0068710 | A1 | 3/2006 | Jensen |
| 2006/0209981 | A1 | 9/2006 | Kluesing et al. |
| 2006/0217083 | A1 | 9/2006 | Braithwaite |
| 2007/0032208 | A1 | 2/2007 | Choi et al. |
| 2008/0246550 | A1 | 10/2008 | Biedka et al. |
| 2009/0004981 | A1 | 1/2009 | Eliezer et al. |
| 2009/0074106 | A1 | 3/2009 | See et al. |
| 2009/0125264 | A1 | 5/2009 | Betts et al. |
| 2009/0141830 | A1 | 6/2009 | Ye |
| 2009/0302945 | A1 | 12/2009 | Catoiu et al. |
| 2010/0298030 | A1 | 11/2010 | Howard |
| 2011/0095826 | A1 | 4/2011 | Hadjichristos et al. |
| 2011/0182347 | A1 * | 7/2011 | Cheung .................... H04B 3/06 375/232 |
| 2011/0227767 | A1 | 9/2011 | O'Brien |
| 2012/0068748 | A1 | 3/2012 | Stojanovic et al. |
| 2012/0139635 | A1 | 6/2012 | Ho et al. |
| 2012/0189081 | A1 | 7/2012 | Omoto et al. |
| 2012/0256688 | A1 | 10/2012 | Onishi |
| 2013/0141062 | A1 | 6/2013 | Khlat |
| 2013/0214858 | A1 | 8/2013 | Tournatory et al. |
| 2013/0222057 | A1 | 8/2013 | Henshaw |
| 2013/0243129 | A1 | 9/2013 | Okuni et al. |
| 2014/0028368 | A1 | 1/2014 | Khlat |
| 2014/0029683 | A1 | 1/2014 | Morris et al. |
| 2014/0062599 | A1 | 3/2014 | Xu et al. |
| 2014/0065989 | A1 | 3/2014 | McLaurin |
| 2014/0072307 | A1 | 3/2014 | Zamani et al. |
| 2014/0084996 | A1 | 3/2014 | Schwent et al. |
| 2014/0105264 | A1 * | 4/2014 | McLaurin ............. H04B 17/11 375/224 |
| 2014/0184337 | A1 | 7/2014 | Nobbe et al. |
| 2014/0213196 | A1 | 7/2014 | Langer et al. |
| 2014/0232470 | A1 | 8/2014 | Wilson |
| 2014/0266432 | A1 | 9/2014 | Scott et al. |
| 2014/0315504 | A1 | 10/2014 | Sakai et al. |
| 2014/0361837 | A1 | 12/2014 | Strange et al. |
| 2015/0028946 | A1 | 1/2015 | Al-Qaq et al. |
| 2016/0173030 | A1 | 6/2016 | Langer et al. |
| 2016/0182100 | A1 | 6/2016 | Menkhoff et al. |
| 2016/0301432 | A1 | 10/2016 | Shizawa et al. |
| 2017/0005676 | A1 | 1/2017 | Yan et al. |
| 2017/0104502 | A1 | 4/2017 | Pratt |
| 2017/0149457 | A1 | 5/2017 | Mayer et al. |
| 2017/0170838 | A1 | 6/2017 | Pagnanelli |
| 2017/0338842 | A1 | 11/2017 | Pratt |
| 2018/0034418 | A1 | 2/2018 | Blednov |
| 2018/0248570 | A1 | 8/2018 | Camuffo |
| 2019/0041890 | A1 | 2/2019 | Chen et al. |
| 2019/0058530 | A1 | 2/2019 | Rainish et al. |
| 2019/0068234 | A1 | 2/2019 | Khlat et al. |
| 2019/0238152 | A1 | 8/2019 | Pagnanelli |
| 2019/0245496 | A1 | 8/2019 | Khlat et al. |
| 2019/0296929 | A1 | 9/2019 | Milicevic et al. |
| 2019/0319583 | A1 | 10/2019 | El-Hassan et al. |
| 2019/0356285 | A1 | 11/2019 | Khlat et al. |
| 2020/0106392 | A1 | 4/2020 | Khlat et al. |
| 2020/0119699 | A1 | 4/2020 | Nishihara et al. |
| 2020/0136563 | A1 | 4/2020 | Khlat |
| 2020/0162030 | A1 | 5/2020 | Drogi et al. |
| 2020/0259685 | A1 | 8/2020 | Khlat |
| 2020/0295713 | A1 | 9/2020 | Khlat |
| 2020/0336111 | A1 | 10/2020 | Khlat |
| 2021/0099136 | A1 | 4/2021 | Drogi et al. |
| 2021/0143859 | A1 | 5/2021 | Hageraats et al. |
| 2021/0194517 | A1 | 6/2021 | Mirea et al. |
| 2021/0281228 | A1 | 9/2021 | Khlat |
| 2021/0399690 | A1 | 12/2021 | Panseri et al. |
| 2022/0021348 | A1 | 1/2022 | Philpott et al. |
| 2022/0216834 | A1 | 7/2022 | Myoung et al. |
| 2022/0407463 | A1 | 12/2022 | Khlat et al. |
| 2022/0407464 | A1 | 12/2022 | Khlat et al. |
| 2022/0407465 | A1 | 12/2022 | Khlat |
| 2022/0407478 | A1 | 12/2022 | Khlat et al. |
| 2023/0079153 | A1 | 3/2023 | Khlat |
| 2023/0080621 | A1 | 3/2023 | Khlat |
| 2023/0080652 | A1 | 3/2023 | Khlat et al. |
| 2023/0081095 | A1 | 3/2023 | Khlat |
| 2023/0082145 | A1 | 3/2023 | Lin et al. |
| 2023/0238927 | A1 | 7/2023 | Kay et al. |
| 2023/0387859 | A1 | 11/2023 | Drogi et al. |

FOREIGN PATENT DOCUMENTS

| | | |
|---|---|---|
| EP | 2705604 A2 | 3/2014 |
| EP | 2582041 B1 | 4/2018 |
| EP | 2232713 B1 | 10/2018 |
| EP | 3416340 A1 | 12/2018 |
| WO | 2007092794 A2 | 8/2007 |
| WO | 2010135711 A1 | 11/2010 |
| WO | 2023150539 A1 | 8/2023 |
| WO | 2023150545 A1 | 8/2023 |

OTHER PUBLICATIONS

U.S. Appl. No. 17/700,685 (Year: 2021).*
U.S. Appl. No. 17/700,826 (Year: 2021).*
International Search Report and Written Opinion for International Patent Application No. PCT/US2023/060303, mailed Apr. 11, 2023, 12 pages.
Non-Final Office Action for U.S. Appl. No. 17/700,700, mailed Apr. 13, 2023, 11 pages.
Bai, W.-D. et al., "Principle of Vector Synthesis Predistortion Linearizers Controlling AM/AM and AM/PM Independently," 2016 IEEE International Conference on Ubiquitous Wireless Broadband (ICUWB), Oct. 16-19, 2016, Nanjing, China, IEEE, 3 pages.
Extended European Search Report for European Patent Application No. 22195695.6, mailed Feb. 14, 2023, 12 pages.
Extended European Search Report for European Patent Application No. 22196188.1, mailed Feb. 2, 2023, 25 pages.
Final Office Action for U.S. Appl. No. 17/942,472, mailed Jul. 19, 2023, 16 pages.
International Search Report and Written Opinion for International Patent Application No. PCT/US2022/043600, mailed Jan. 11, 2023, 15 pages.

(56) References Cited

OTHER PUBLICATIONS

Non-Final Office Action for U.S. Appl. No. 17/942,472, mailed Feb. 16, 2023, 13 pages.
Extended European Search Report for European Patent Application No. 22195382.1, mailed Feb. 1, 2023, 26 pages.
Extended European Search Report for European Patent Application No. 22195683.2, mailed Feb. 10, 2023, 12 pages.
Advisory Action for U.S. Appl. No. 17/942,472, mailed Sep. 15, 2023, 3 pages.
Notice of Allowance for U.S. Appl. No. 17/942,472, mailed Oct. 18, 2023, 10 pages.
International Search Report and Written Opinion for International Patent Application No. PCT/US2023/019267, mailed Aug. 3, 2023, 14 pages.
Cho, M., "Analog Predistortion for Improvement of RF Power Amplifier Efficiency and Linearity," A Dissertation presented to the Academic Faculty in partial fulfillment of the requirements for the degree Doctor of Philosophy in the School of Electrical and Computer Engineering, Georgia Institute of Technology, Aug. 2016, available from the Internet: [URL: https://repository.gatech.edu/server/api/core/bitstreams/b8fe5cbb-e5db-4efe-b9a2-eaad5f671f14/ content], 113 pages.
Kwak, T.-W. et al., "A 2W CMOS Hybrid Switching Amplitude Modulator for EDGE Polar Transmitters," IEEE Journal of Solid-State Circuits, vol. 42, No. 12, Dec. 2007, IEEE, pp. 2666-2676.
Paek, J.-S. et al., "A-137 dBm/Hz Noise, 82% Efficiency AC-Coupled Hybrid Supply Modulator With Integrated Buck-Boost Converter," IEEE Journal of Solid-State Circuits, vol. 51, No. 11, Nov. 2016, IEEE pp. 2757-2768.
Non-Final Office Action for U.S. Appl. No. 17/737,300, mailed Aug. 28, 2023, 14 pages.
Extended European Search Report for European Patent Application No. 23153108.8, mailed Jun. 20, 2023, 18 pages.
U.S. Appl. No. 17/700,685, filed Mar. 22, 2022.
U.S. Appl. No. 17/714,244, filed Apr. 6, 2022.
U.S. Appl. No. 17/700,826, filed Mar. 22, 2022.
Williams, P., "Crossover Filter Shape Comparisons," White Paper, Linea Research, Jul. 2013, 13 pages.
Corrected Notice of Allowability for U.S. Appl. No. 17/942,472, mailed Nov. 17, 2023, 6 pages.
Non-Final Office Action for U.S. Appl. No. 17/939,350, mailed Jan. 17, 2024, 11 pages.
Paek, J.-S. et al., "Design of Boosted Supply Modulator With Reverse Current Protection for Wide Battery Range in Envelope Tracking Operation," IEEE Transactions on Microwave Theory and Techniques, vol. 67, No. 1, Jan. 2019, pp. 183-194.
Non-Final Office Action for U.S. Appl. No. 17/700,685, mailed Dec. 22, 2023, 24 pages.
Notice of Allowance and Examiner-Initiated Interview Summary for U.S. Appl. No. 17/737,300, mailed Dec. 19, 2023, 12 pages.
Notice of Allowance for U.S. Appl. No. 17/700,700, mailed Oct. 23, 2023, 9 pages.
Supplemental Notice of Allowability for U.S. Appl. No. 17/700,700, mailed Nov. 8, 2023, 5 pages.
Extended European Search Report for European Patent Application No. 23174010.1, mailed Oct. 10, 2023, 10 pages.
Corrected Notice of Allowability for U.S. Appl. No. 17/737,300, mailed Dec. 27, 2023, 8 pages.
Notice of Allowance for U.S. Appl. No. 17/700,685, mailed Apr. 5, 2024, 7 pages.
Supplemental Notice of Allowability for U.S. Appl. No. 17/700,700, mailed Feb. 28, 2024, 5 pages.
Final Office Action for U.S. Appl. No. 17/939,350, mailed May 21, 2024, 11 pages.
Non-Final Office Action for U.S. Appl. No. 17/700,826, mailed May 15, 2024, 28 pages.
International Search Report and Written Opinion for International Patent Application No. PCT/US2023/061734, mailed May 30, 2023, 15 pages.
International Search Report and Written Opinion for International Patent Application No. PCT/US2023/061741, mailed Jun. 1, 2023, 14 pages.
Invitation to Pay Additional Fees and Partial International Search for International Patent Application No. PCT/US2023/061804, mailed May 26, 2023, 10 pages.
International Search Report and Written Opinion for International Patent Application No. PCT/US2023/061804, mailed Jul. 17, 2023, 20 pages.
Notice of Allowance for U.S. Appl. No. 17/714,244, mailed Sep. 16, 2024, 8 pages.
Non-Final Office Action for U.S. Appl. No. 17/939,350, mailed Sep. 6, 2024, 8 pages.
Non-Final Office Action for U.S. Appl. No. 17/890,538, mailed Oct. 21, 2024, 13 pages.
Notice of Allowance and Examiner-Initiated Interview Summary for U.S. Appl. No. 17/700,826, mailed Sep. 11, 2024, 10 pages.
Notice of Allowance for U.S. Appl. No. 17/939,350, mailed Dec. 20, 2024, 10 pages.
Non-Final Office Action for U.S. Appl. No. 17/939,372, mailed Dec. 12, 2024, 18 pages.
Notice of Allowance for U.S. Appl. No. 17/826,311, mailed Dec. 13, 2024, 7 pages.

* cited by examiner

WIDEBAND TRANSMISSION CIRCUIT

RELATED APPLICATIONS

This application claims the benefit of provisional patent application Ser. No. 63/212,453, filed Jun. 18, 2021, the disclosure of which is hereby incorporated herein by reference in its entirety.

FIELD OF THE DISCLOSURE

The technology of the disclosure relates generally to a transmission circuit that transmits a radio frequency (RF) signal modulated in a wide modulation bandwidth.

BACKGROUND

Mobile communication devices have become increasingly common in current society for providing wireless communication services. The prevalence of these mobile communication devices is driven in part by the many functions that are now enabled on such devices. Increased processing capability in such devices means that mobile communication devices have evolved from being pure communication tools into sophisticated mobile multimedia centers that enable enhanced user experiences.

The redefined user experience relies on a higher data rate offered by advanced fifth generation (5G) and 5G new radio (5G-NR) technologies, which typically transmit and receive radio frequency (RF) signals in millimeter wave spectrums. Given that the RF signals are more susceptible to attenuation and interference in the millimeter wave spectrums, the RF signals are typically amplified by state-of-the-art power amplifiers to help boost the RF signals to higher power before transmission.

Envelope tracking (ET) is a power management technology designed to improve operating efficiency and/or linearity performance of the power amplifiers. In an ET power management circuit, a power management integrated circuit (PMIC) is configured to generate a time-variant ET voltage based on a time-variant power envelope of the RF signals, and the power amplifiers are configured to amplify the RF signals based on the time-variant ET voltage. Understandably, the better the time-variant ET voltage is aligned with the time-variant power envelope in time and amplitude, the better the performance (e.g., efficiency and/or linearity) that can be achieved at the power amplifiers. However, the time-variant ET voltage can become misaligned from the time-variant power envelope in time and/or amplitude due to a range of factors (e.g., group delay, impedance mismatch, etc.). As such, it is desirable to maintain good alignment between the time-variant voltage and the time-variant power envelope at all times and across a wide modulation bandwidth.

SUMMARY

Embodiments of the disclosure relate to a wideband transmission circuit. The wideband transmission circuit includes a power amplifier circuit(s) and an envelope tracking (ET) integrated circuit (ETIC). The ETIC is configured to generate a modulated voltage based on a modulated target voltage and provide the modulated voltage to the power amplifier circuit(s). The power amplifier circuit(s) amplifies a radio frequency (RF) signal(s) based on the modulated voltage and provides the amplified RF signal(s) to a coupled RF front-end circuit (e.g., filter/multiplexer circuit). Notably, when the power amplifier circuit(s) is coupled to the RF front-end circuit, an output reflection coefficient (e.g., $S_{22}$) of the power amplifier circuit(s) can interact with an input reflection coefficient (e.g., $S_{11}$) of the RF front-end circuit to create a complex voltage distortion filter on an output stage of the power amplifier circuit(s), which can cause unwanted distortion in the RF signal(s). In this regard, in embodiments disclosed herein, the ETIC is configured to cause the modulated target voltage to be equalized by a real equalization filter to thereby compensate for the complex voltage distortion filter. By equalizing the modulated target voltage, it is possible to reduce undesired instantaneous excessive compression and/or spectrum regrowth resulting from the complex voltage distortion filter to thereby improve efficiency and linearity of the power amplifier circuit(s).

In one aspect, a wideband transmission circuit is provided. The wideband transmission circuit includes a power amplifier circuit coupled to a transmitter circuit via an RF front-end circuit. The power amplifier circuit is configured to amplify an RF signal based on a modulated voltage and provide the amplified RF signal to the RF front-end circuit. The wideband transmission circuit also includes an ETIC. The ETIC includes a voltage modulation circuit. The voltage modulation circuit is configured to generate the modulated voltage based on a modulated target voltage. The ETIC also includes a target voltage circuit. The target voltage circuit is configured to cause the modulated target voltage to be equalized by a real equalization filter to compensate for a complex voltage distortion filter created on an output stage of the power amplifier circuit by a coupling of the power amplifier circuit with the RF front-end circuit.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
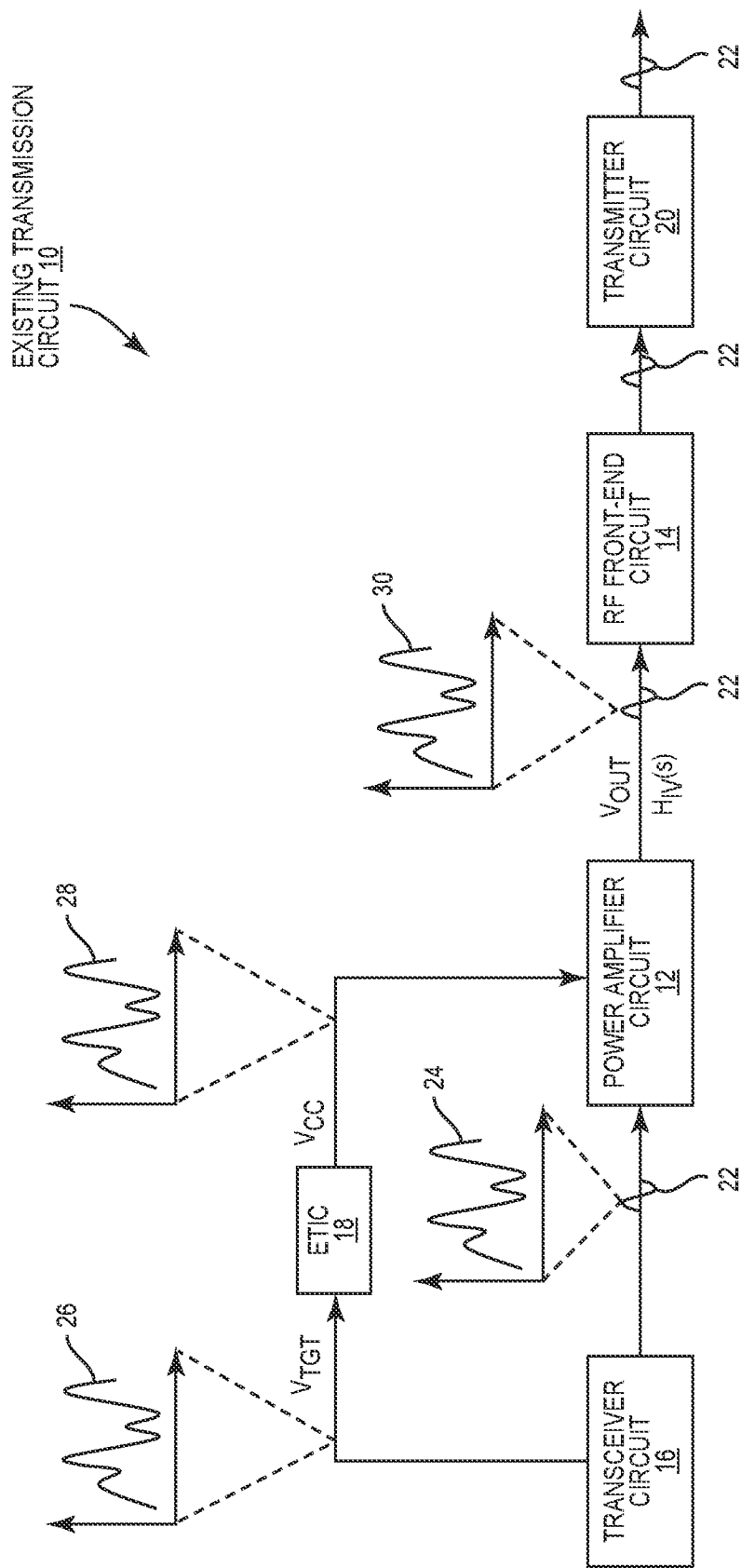
FIG. 1A is a schematic diagram of an exemplary existing transmission circuit, wherein an unwanted complex voltage distortion filter may be created on a power amplifier circuit when the power amplifier circuit is coupled to a radio frequency (RF) front-end circuit.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a wideband transmission circuit. The wideband transmission circuit includes a power amplifier circuit(s) and an envelope tracking (ET) integrated circuit (ETIC). The ETIC is configured to generate a modulated voltage based on a modulated target voltage and provide the modulated voltage to the power amplifier circuit(s). The power amplifier circuit(s) amplifies a radio frequency (RF) signal(s) based on the modulated voltage and provides the amplified RF signal(s) to a coupled RF front-end circuit (e.g., filter/multiplexer circuit). Notably, when the power amplifier circuit(s) is coupled to the RF front-end circuit, an output reflection coefficient (e.g., $S_{22}$) of the power amplifier circuit(s) can interact with an input reflection coefficient (e.g., $S_{11}$) of the RF front-end circuit to create a complex voltage distortion filter on an output stage of the power amplifier circuit(s), which can cause unwanted distortion in the RF signal(s). In this regard, in embodiments disclosed herein, the ETIC is configured to cause the modulated target voltage to be equalized by a real equalization filter to thereby compensate for the complex voltage distortion filter. By equalizing the modulated target voltage, it is possible to reduce undesired instantaneous excessive compression and/or spectrum regrowth resulting from the complex voltage distortion filter to thereby improve efficiency and linearity of the power amplifier circuit(s).

Figure 2:
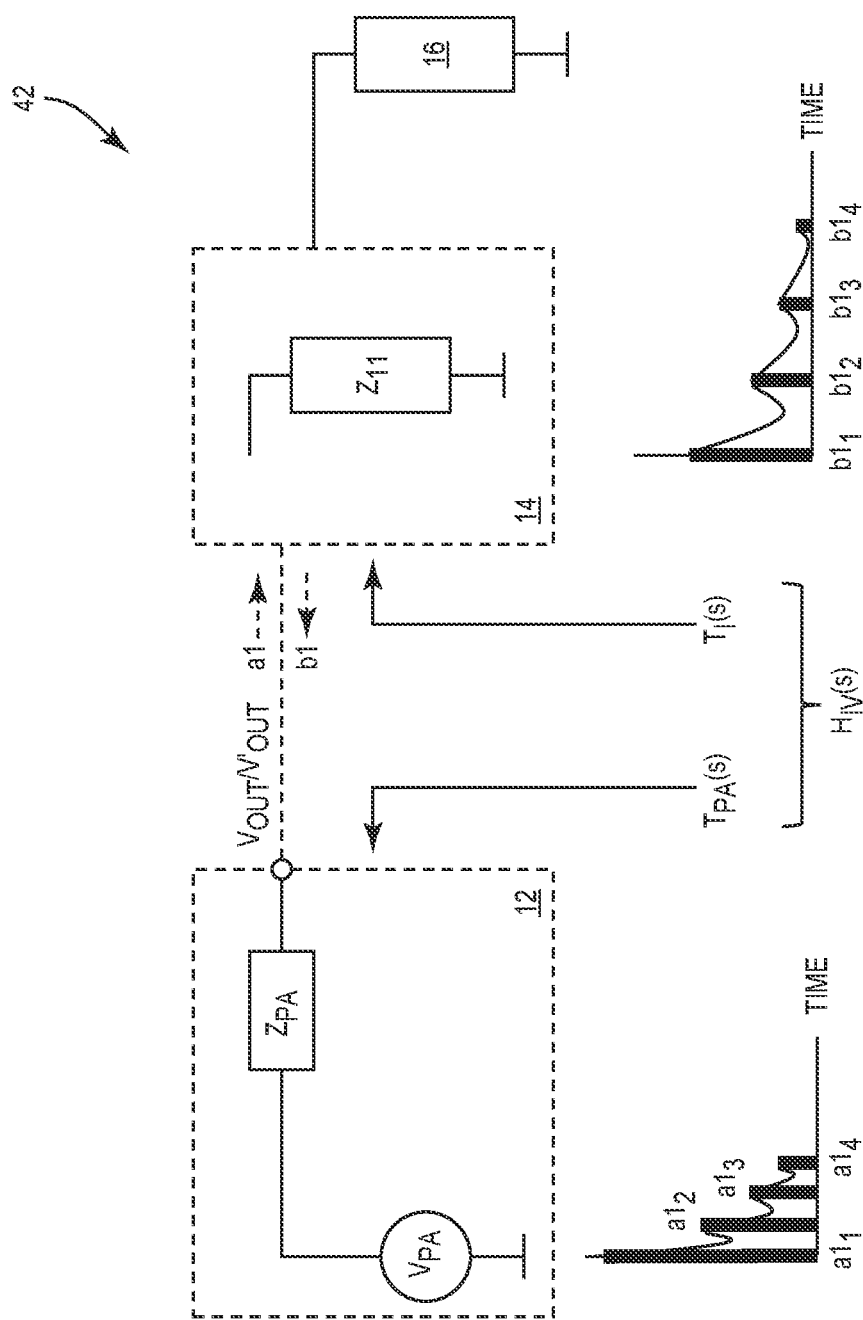
FIG. 2 is a schematic diagram of an exemplary equivalent model providing an exemplary illustration of the unwanted complex voltage distortion filter created by a coupling between the power amplifier circuit and the RF front-end circuit 14 in FIG. 1A.

Before discussing the wide modulation bandwidth RF transmission circuit according to the present disclosure, starting at FIG. 2, a brief discussion of an existing transmission circuit is first provided to help understand how an unwanted complex voltage distortion filter may be created when a power amplifier circuit is coupled to an RF front-end circuit, such as a filter/multiplexer circuit.

FIG. 1A is a schematic diagram of an exemplary existing transmission circuit 10, wherein an unwanted complex voltage distortion filter $H_{IV}(s)$ may be created on a power amplifier circuit 12 when the power amplifier circuit 12 is coupled to an RF front-end circuit 14. Notably, in the unwanted complex voltage distortion filter $H_{IV}(s)$, "s" is a notation of Laplace transform. The existing transmission circuit 10 includes a transceiver circuit 16, an envelope tracking (ET) integrated circuit (ETIC) 18, and a transmitter circuit 20.

The transceiver circuit 16 is configured to generate an RF signal 22 associated with a time-variant power envelope 24 and provide the RF signal 22 to the power amplifier circuit 12. The transceiver circuit 16 is also configured to generate a time-variant target voltage $V_{TGT}$, which is associated with a time-variant target voltage envelope 26 that tracks the time-variant power envelope 24 of the RF signal 22. The ETIC 18 is configured to generate a modulated voltage $V_{CC}$ having a time-variant modulated voltage envelope 28 that tracks the time-variant target voltage envelope 26 of the time-variant target voltage $V_{TGT}$ and provide the modulated voltage $V_{CC}$ to the power amplifier circuit 12. The power amplifier circuit 12 is configured to amplify the RF signal 22 based on the modulated voltage $V_{CC}$ to a time-variant output voltage $V_{OUT}$ associated with a time-variant output voltage envelope 30. The power amplifier circuit 12 then provides the amplified RF signal 22 to the RF front-end circuit 14. The RF front-end circuit 14 may be a filter circuit that performs further frequency filtering on the amplified RF signal 22 before providing the amplified RF signal 22 to the transmitter circuit 20 for transmission.

Figure 1B:
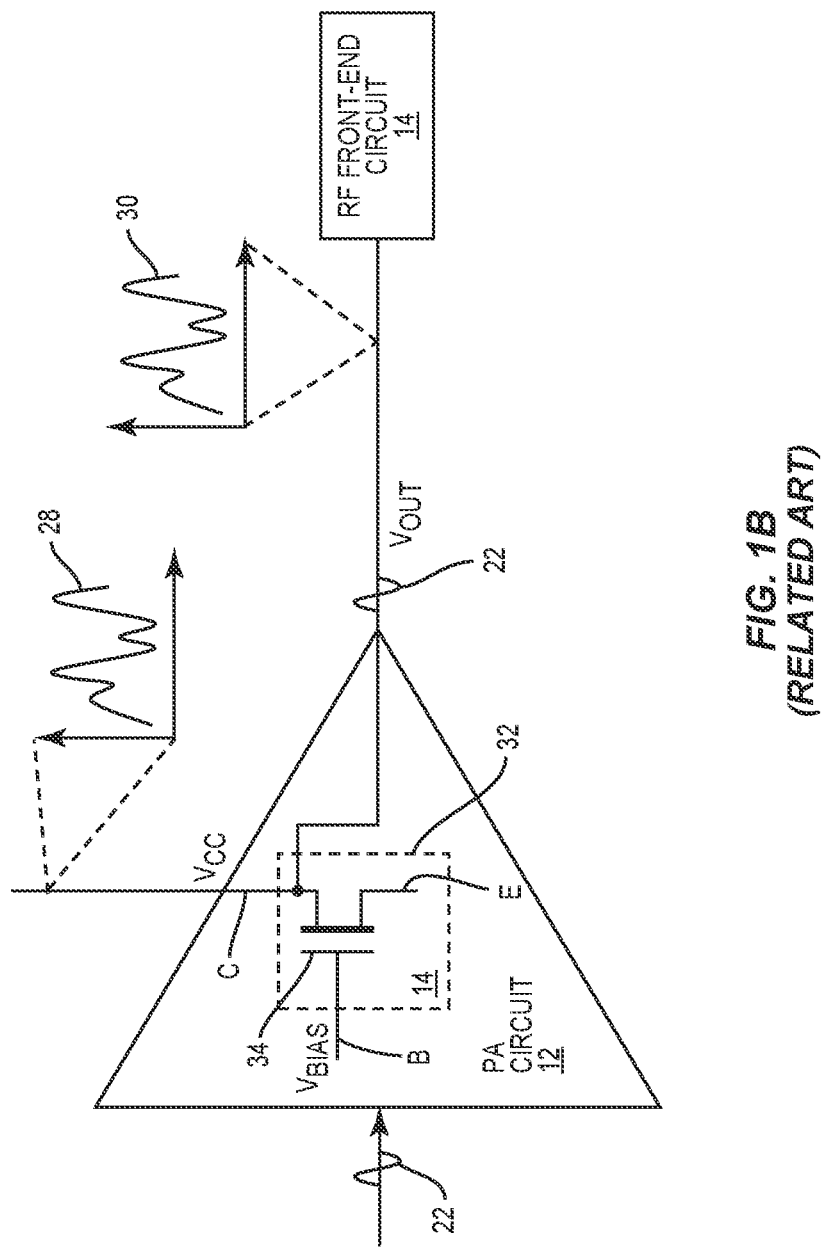
FIG. 1B is a schematic diagram providing an exemplary illustration of an output stage of the power amplifier circuit in FIG. 1A.

FIG. 1B is a schematic diagram providing an exemplary illustration of an output stage 32 of the power amplifier circuit 12 in FIG. 1A. Common elements between FIGS. 1A and 1B are shown therein with common element numbers and will not be re-described herein.

The output stage 32 can include at least one transistor 34, such as a bipolar junction transistor (BJT) or a complementary metal-oxide semiconductor (CMOS) transistor. Taking the BJT as an example, the transistor 34 can include a base electrode B, a collector electrode C, and an emitter electrode E. The base electrode B is configured to receive a bias voltage $V_{BIAS}$ and the collector electrode C is configured to receive the modulated voltage $V_{CC}$. The collector electrode C is also coupled to the RF front-end circuit 14 and configured to output the amplified RF signal 22 at the output voltage $V_{OUT}$. In this regard, the output voltage $V_{OUT}$ can be a function of the modulated voltage $V_{CC}$. Understandably, the power amplifier circuit 12 will operate with good efficiency and linearity when the time-variant modulated voltage envelope 28 is aligned with the time-variant output voltage envelope 30.

Figure 1C:
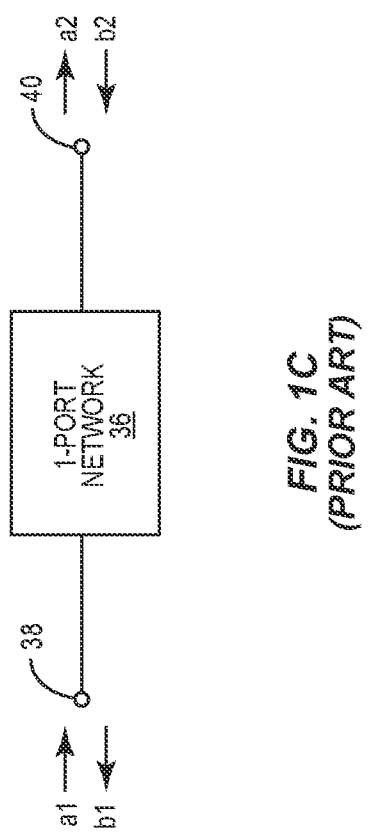
FIG. 1C is a schematic diagram providing an exemplary illustration of a well-known one-port network that models a coupling between the power amplifier circuit and the RF front-end circuit in FIG. 1A.

With reference back to FIG. 1A, a coupling between the power amplifier circuit 12 and the RF front-end circuit 14 can be modeled by a well-known one-port network, as illustrated in FIG. 1C. FIG. 1C is a schematic diagram providing an exemplary illustration of a one-port network 36 that models a coupling between the power amplifier circuit 12 and the RF front-end circuit 14 in FIG. 1A.

The one-port network 36 is commonly modeled by an input port 38 and an output port 40. In the context of the existing transmission circuit 10, the output port 40 is equivalent to an output of the power amplifier circuit 12 that outputs the amplified RF signal 22, and the input port 38 is equivalent to an input of the RF front-end circuit 14 that receives the amplified RF signal 22 from the power amplifier circuit 12.

Herein, a well-known S-parameter $S_{11}$ represents an input reflection coefficient of the one-port network 36 and another well-known S-parameter $S_{22}$ represents an output reflection coefficient of the one-port network 36, which can be expressed in the equation (Eq. 1) below.

$$S_{11} = b1/a1$$

$$S_{22} = b2/a2 \qquad \text{(Eq. 1)}$$

In the equation (Eq. 1) above, a1 represents an input signal and b1 represents an input reflection signal at the input port 38, while a2 represents an output signal and b2 represents an output reflection signal at the output port 40. When the power amplifier circuit 12 is coupled to the RF front-end circuit 14 in the existing transmission circuit 10 of FIG. 1A, the output port 40 of the power amplifier circuit 12 will be coupled to the input port 38 of the RF front-end circuit 14. As further discussed in FIG. 2, the output reflection coefficient $S_{22}$ of the power amplifier circuit 12 can interact with the input reflection coefficient $S_{11}$ of the RF front-end circuit 14 to create a complex voltage distortion filter $H_{IV}(s)$ at the output stage 32 of the power amplifier circuit 12, which can cause unwanted distortion in the RF signal 22.

FIG. 2 is a schematic diagram of an exemplary equivalent model 42 providing an exemplary illustration of the complex voltage distortion filter $H_{IV}(s)$ created by a coupling between the power amplifier circuit 12 and the RF front-end circuit 14 in the existing transmission circuit 10 of FIG. 1A. Elements in FIGS. 1A, 1B, and 1C are referenced in FIG. 2 without being re-described herein.

In the equivalent model 42, $V_{PA}$ and $Z_{PA}$ represent the output stage 32 of the power amplifier circuit 12 and an inherent impedance of the power amplifier circuit 12, respectively, a1 and b1 represent the input signal and the input reflection signal at the input port 38 of the RF front-end circuit 14, and $Z_{11}$ represents an inherent impedance associated with the input port 38 of the RF front-end circuit 14. Herein, $V_{OUT}$ represents an output voltage associated with the RF signal 22 before the power amplifier circuit 12 is coupled to the RF front-end circuit 14, and $V'_{OUT}$ represents an output voltage associated with the RF signal 22 after the power amplifier circuit 12 is coupled to the RF front-end circuit 14. Hereinafter, the output voltages $V_{OUT}$ and $V'_{OUT}$ are referred to as "non-coupled output voltage" and "coupled output voltage," respectively, for distinction.

A Laplace transform representative of the coupled output voltage $V'_{OUT}$ can be expressed in equation (Eq. 2) below.

$$V'_{OUT(s)} = \frac{V_{OUT}(s) * [1 - T_{PA}(s)] * [1 + T_I(s)]}{2 * [1 - T_{PA}(s) * T_I(s)]} = V_{OUT}(s) * H_{IV}(s) \qquad \text{(Eq. 2)}$$

$$H_{IV}(s) = \frac{[1 - T_{PA}(s)] * [1 + T_I(s)]}{2 * [1 - T_{PA}(s) * T_I(s)]}$$

In the equation (Eq. 2) above, $T_{PA}(s)$ represents a reflection coefficient applied to the output stage 32 of the power amplifier circuit 12 and $T_I(s)$ represents a reflection coefficient applied to the RF front-end circuit 14. Notably, $T_{PA}(s)$ and $T_I(s)$ are complex filters containing amplitude and phase information. In this regard, the $T_{PA}(s)$, the $T_I(s)$, and, therefore, the complex voltage distortion filter $H_{IV}(s)$ are dependents of such factors as modulation bandwidth, RF spectrum, and/or voltage standing wave ratio (VSWR).

Moreover, the input signal a1 and the input reflection signal b1 can each be a compounded result of multiple forward and reverse signals bouncing back and forth between the power amplifier circuit 12 and the RF front-end circuit 14. For example, a forward signal $a1_1$ propagating from the power amplifier circuit 12 toward the RF front-end circuit 14 can cause a reverse signal $b1_1$ propagating from the RF front-end circuit 14 toward the power amplifier circuit 12, the reverse signal $b1_1$ can cause another forward signal $a1_2$ that can cause another reverse signal $b1_2$, and so on. As such, the input signal a1 can be a compounded signal of multiple forward signals $a1_1$, $a1_2$, $a1_3$, $a1_4$, and so on. Likewise, the input reflection signal b1 can be a compounded signal of multiple reverse signals $b1_1$, $b1_2$, $b1_3$, $b1_4$, and so on.

The equation (Eq. 2) shows that the coupled output voltage $V'_{OUT}$ will be altered from the non-coupled output voltage $V_{OUT}$ by the complex voltage distortion filter $H_{IV}(s)$ when the power amplifier circuit 12 is coupled to the RF front-end circuit 14. As a result, the coupled output voltage $V'_{OUT}$ may become misaligned from the modulated voltage $V_{CC}$, thus causing unwanted distortion in the RF signal 22.

According to various embodiments disclosed herein, it is possible to modify the modulated voltage $V_{CC}$ to compensate for the complex voltage distortion filter $H_{IV}(s)$ to thereby reduce or eliminate the difference between the non-coupled output voltage $V_{OUT}$ and the coupled output voltage $V'_{OUT}$. As a result, it is possible to reduce undesired instantaneous excessive compression and/or spectrum regrowth resulting from the complex voltage distortion filter $H_{IV}(s)$.

Figure 3:
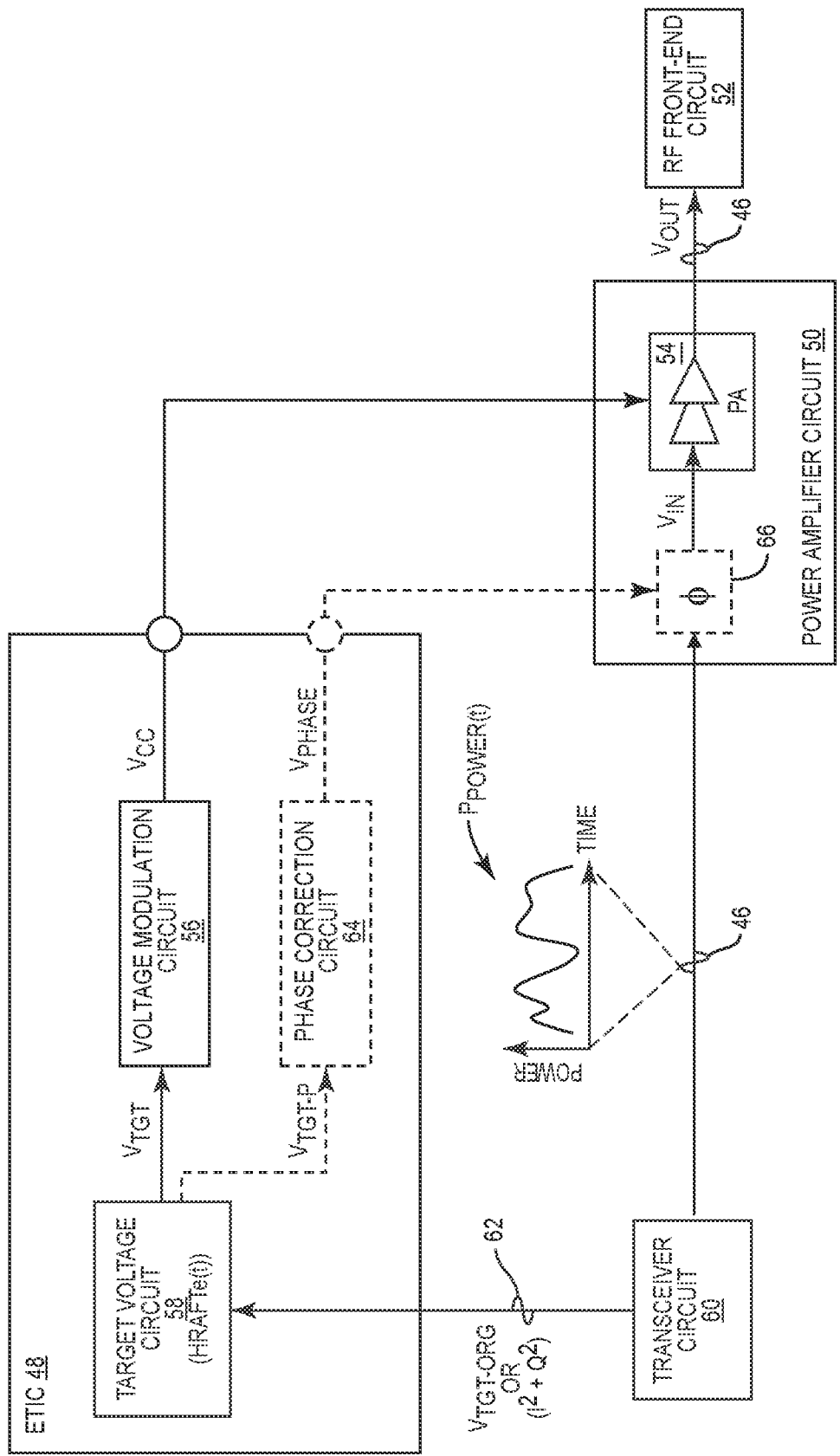
FIG. 3 is a schematic diagram of an exemplary wideband transmission circuit configured according to an embodiment of the present disclosure to compensate for the unwanted complex voltage distortion filter in the existing transmission circuit of FIG. 1A.

FIG. 3 is a schematic diagram of an exemplary wideband transmission circuit 44 configured according to an embodiment of the present disclosure to compensate for the unwanted complex voltage distortion filter $H_{IV}(s)$ in the existing transmission circuit 10 of FIG. 1A. The wideband transmission circuit 44 is configured to transmit an RF signal 46 modulated in a wide range of modulation bandwidths. In a non-limiting example, the RF signal 46 can be modulated in a modulation bandwidth of 200 MHz or higher and transmitted in a millimeter wave RF spectrum.

The wideband transmission circuit 44 includes an ETIC 48 and a power amplifier circuit 50. The power amplifier circuit 50 is coupled to an RF front-end circuit 52. In a non-limiting example, the RF front-end circuit 52 can include one or more of a filter circuit and a multiplexer circuit (not shown). The filter circuit may be configured to include a filter network, such as an acoustic filter network with a sharp cutoff frequency. The power amplifier circuit 50 may be identical to or functionally equivalent to the power amplifier circuit 12 in FIG. 1B. As such, the power amplifier circuit 50 may also include the output stage 32 as in the power amplifier circuit 12.

The power amplifier circuit 50 may include a power amplifier 54, which can be a multi-stage power amplifier, a Doherty power amplifier, a differential power amplifier, a quadrature power amplifier, and so on. The power amplifier 54 is configured to amplify the RF signal 46 from an input voltage $V_{IN}$ to an output voltage $V_{OUT}$ based on a modulated voltage $V_{CC}$. Like the power amplifier circuit 12 in FIG. 1B, the power amplifier 54 also includes the output stage 32. In this regard, the output voltage $V_{OUT}$ is a function of the modulated voltage $V_{CC}$ and can be affected by the complex voltage distortion filter $H_{IV}(s)$ shown in FIG. 2.

The ETIC 48 includes a voltage modulation circuit 56, which is configured to generate the modulated voltage $V_{CC}$ based on a modulated target voltage $V_{TGT}$. The ETIC 48 also includes a target voltage circuit 58 that generates the modulated target voltage $V_{TGT}$. In various embodiments described herein, the target voltage circuit 58 is further configured to manipulate the modulated target voltage $V_{TGT}$ based on a real equalization filter HRAFTe(t) to thereby compensate for the complex voltage distortion filter $H_{IV}(s)$ created on the output stage 32 of the power amplifier circuit 50 by a coupling of the power amplifier circuit 50 with the RF front-end circuit 52. Given that the voltage modulation circuit 56 is configured to generate the modulated voltage $V_{CC}$ based on the modulated target voltage $V_{TGT}$, it is possible to reduce or even eliminate the difference between the non-coupled output voltage $V_{OUT}$ and the coupled output voltage $V'_{OUT}$, thus helping to prevent potential distortion (e.g., amplitude clipping) in the RF signal 46.

Notably, the real equalization filter HRAFTe(t) is a real filter, as opposed to a complex filter like the complex voltage distortion filter HIV(s). Herein, a real filter refers to a digital filter that can map every real, discrete-time input signal to a real, discrete-time output signal. This is different from a complex filter, which may produce a complex output signal even when the input signal is a real signal.

The wideband transmission circuit 44 may include or be coupled to a transceiver circuit 60. The transceiver circuit 60 is configured to generate the RF signal 46 associated with a time-variant power envelope $P_{POWER}(t)$ and provide the RF signal 46 to the power amplifier circuit 50. In a non-limiting example, the transceiver circuit 60 first generates a digital version of the RF signal 46 that includes an in-phase (I) component and a quadrature (Q) component and subsequently performs a digital-to-analog conversion to generate the RF signal 46. As such, the transceiver circuit 60 may detect a time-variant amplitude $I^2+Q^2$ of the RF signal 22 by sampling the time-variant power envelope $P_{POWER}(t)$.

In one embodiment, the transceiver circuit 60 may generate an initial modulated target voltage $V_{TGT\text{-}ORG}$ based on the detected time-variant amplitude $I^2+Q^2$ of the RF signal 22. In this regard, the transceiver circuit 60 may provide an indication signal 62 to indicate the initial modulated target voltage $V_{TGT\text{-}ORG}$ to the target voltage circuit 58. The target voltage circuit 58, in turn, may apply the real equalization filter HRAFTe(t) to the initial modulated target voltage $V_{TGT\text{-}ORG}$ to thereby generate the modulated target voltage $V_{TGT}$. Accordingly, the voltage modulation circuit 56 may generate the modulated voltage $V_{CC}$ based on the modulated target voltage $V_{TGT}$ and provide the modulated voltage $V_{CC}$ to the power amplifier 54 for amplifying the RF signal 46.

Alternatively, the transceiver circuit 60 may provide the indication signal 62 to indicate the detected time-variant amplitude $I^2+Q^2$ to the target voltage circuit 58. In this regard, the target voltage circuit 58 may apply the real equalization filter HRAFTe(t) to the time-variant amplitude $I^2+Q^2$ and then generate the modulated target voltage $V_{TGT}$ based on the equalized time-variant amplitude $I^2+Q^2$. Accordingly, the voltage modulation circuit 56 may generate the modulated voltage $V_{CC}$ based on the modulated target voltage $V_{TGT}$ and provide the modulated voltage $V_{CC}$ to the power amplifier 54 for amplifying the RF signal 46.

Notably, since the RF signal 46 and the modulated voltage $V_{CC}$ arrive at the power amplifier 54 via different paths, the RF signal 46 and the modulated voltage $V_{CC}$ may experience different group delays. As a result, the RF signal 46 and the modulated voltage $V_{CC}$ can become phase misaligned at the power amplifier 54. To help correct the phase misalignment, the ETIC 48 may also include a phase correction circuit 64 configured to generate a modulated phase correction voltage $V_{PHASE}$ based on a modulated phase correction target voltage $V_{TGT\text{-}P}$.

The power amplifier circuit 50 may further include a phase shifter circuit 66 coupled in series to the power amplifier 54. The phase shifter circuit 66 may receive the modulated phase correction voltage $V_{PHASE}$ from the phase correction circuit 64. The phase shifter circuit 66 may include internal storage (not shown), such as registers for example, to store a correlation between various levels of the modulated phase correction voltage $V_{PHASE}$ and various degrees of phase shift. For example, storing a correlation between the modulated phase correction voltage $V_{PHASE}$ of 0 V, 1 V, and 2 V and a phase shift of 0°, 1°, and 2UNS °, respectively. Accordingly, the phase shifter circuit 66 can determine a phase shift based on the modulated phase correction voltage $V_{PHASE}$ and phase-shift the RF signal 46 based on the determined phase shift.

In this regard, in addition to generating the modulated target voltage $V_{TGT}$, the target voltage circuit 58 may be further configured to generate the modulated phase correction target voltage $V_{TGT\text{-}P}$. FIGS. 4A-4D are schematic diagrams providing exemplary illustrations of the target voltage circuit 58 according to various embodiments of the present disclosure. Common elements between FIGS. 3 and 4A-4E are shown therein with common element numbers and will not be re-described herein.

Figures 4A, 4B:
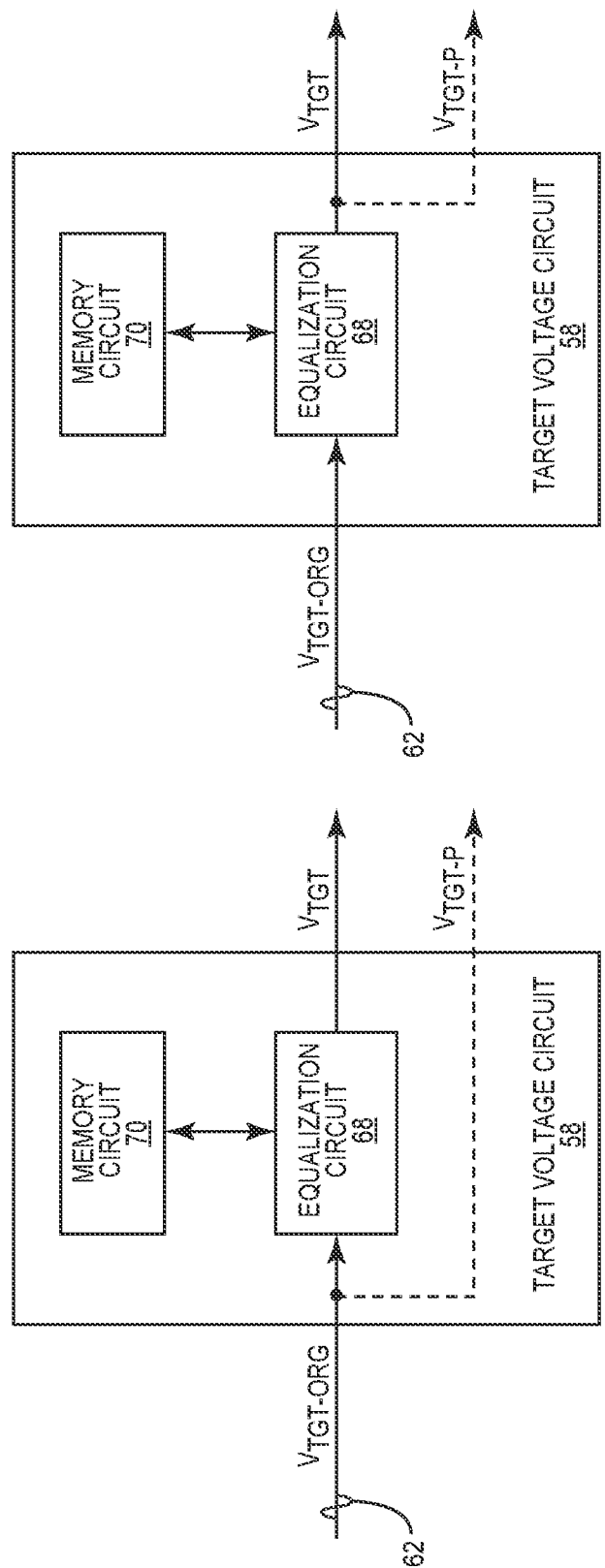
FIGS. 4A-4F are schematic diagrams providing exemplary illustrations of a target voltage circuit in the wideband transmission circuit of FIG. 3 according to various embodiments of the present disclosure.

FIG. 4A is a schematic diagram of the target voltage circuit 58 configured according to one embodiment of the present disclosure. In a non-limiting example, the target voltage circuit 58 includes an equalization circuit 68 and a memory circuit 70. In this embodiment, the equalization circuit 68 is configured to generate the real equalization filter HRAFTe(t) based on one or more lookup tables (LUTs) (not shown) stored in the memory circuit 70. The equalization circuit 68 receives the initial modulated target voltage $V_{TGT-ORG}$ in the indication signal 62. Accordingly, the equalization circuit 68 can apply the real equalization filter HRAFTe(t) to the initial modulated target voltage $V_{TGT-ORG}$ to thereby generate the modulated target voltage $V_{TGT}$. In case the phase correction circuit 64 is provided in the ETIC 48, the target voltage circuit 58 is further configured to output the initial modulated target voltage $V_{TGT-ORG}$ as the modulated phase correction target voltage $V_{TGT-P}$.

FIG. 4B is a schematic diagram of the target voltage circuit 58 configured according to another embodiment of the present disclosure. In this embodiment, the equalization circuit 68 receives the initial modulated target voltage $V_{TGT-ORG}$ in the indication signal 62 and applies the real equalization filter HRAFTe(t) to the initial modulated target voltage $V_{TGT-ORG}$ to thereby generate the modulated target voltage $V_{TGT}$ and the modulated phase correction target voltage $V_{TGT-P}$.

Figure 4C:
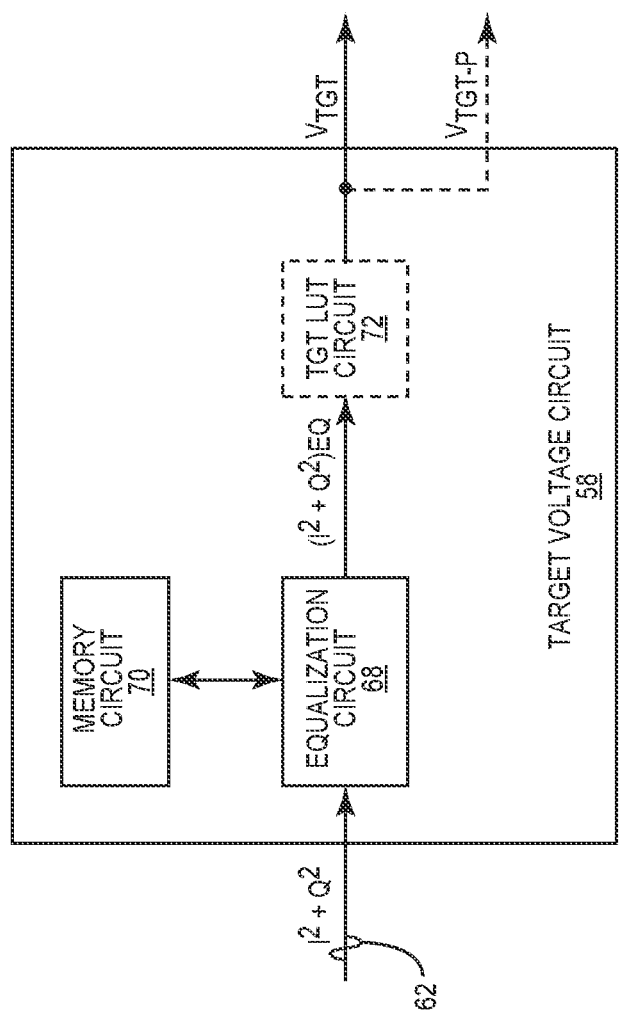

FIG. 4C is a schematic diagram of the target voltage circuit 58 configured according to another embodiment of the present disclosure. In this embodiment, the equalization circuit 68 receives the time-variant amplitude $I^2+Q^2$ in the indication signal 62 and applies the real equalization filter HRAFTe(t) to the time-variant amplitude $I^2+Q^2$ to generate an equalized time-variant amplitude $(I^2+Q^2)_{EQ}$. The target voltage circuit 58 may further include a target voltage LUT circuit 72 that is configured to generate the modulated target voltage $V_{TGT}$ and the modulated phase correction target voltage $V_{TGT-P}$ based on the equalized time-variant amplitude $(I^2+Q^2)_{EQ}$.

Figure 4D:
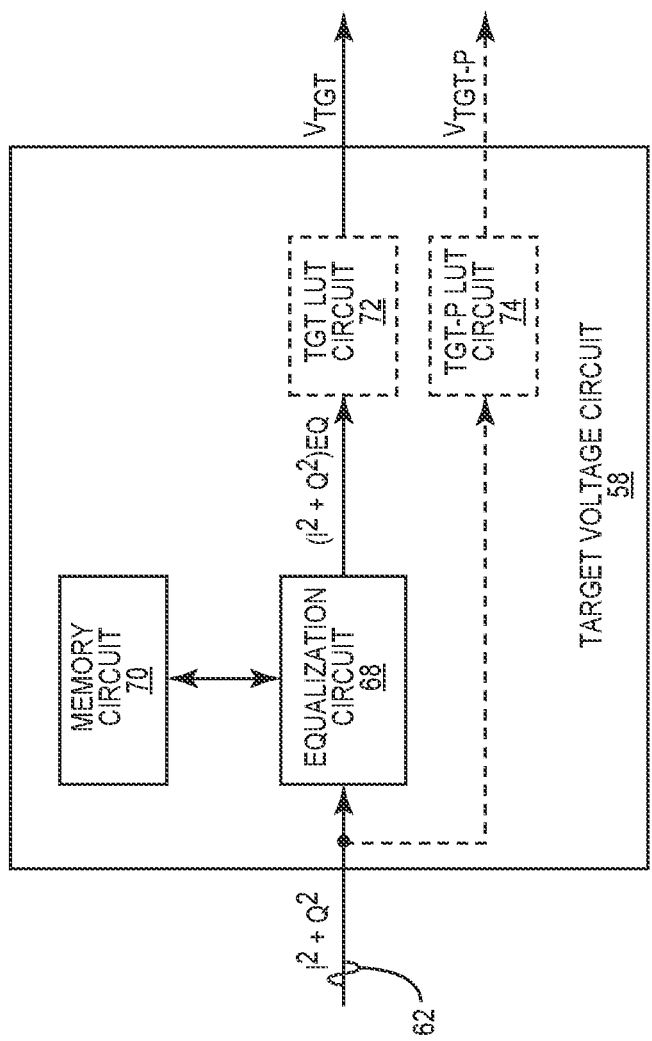

FIG. 4D is a schematic diagram of the target voltage circuit 58 configured according to another embodiment of the present disclosure. In this embodiment, the equalization circuit 68 receives the time-variant amplitude $I^2+Q^2$ in the indication signal 62 and applies the real equalization filter HRAFTe(t) to the time-variant amplitude $I^2+Q^2$ to generate an equalized time-variant amplitude $(I^2+Q^2)_{EQ}$. The target voltage LUT circuit 72 is configured to generate the modulated target voltage $V_{TGT}$ based on the equalized time-variant amplitude $(I^2+Q^2)_{EQ}$. The target voltage circuit 58 may include a phase correction voltage LUT 74, which is configured to generate the modulated phase correction target voltage $V_{TGT-P}$ based on the time-variant amplitude $I^2+Q^2$.

Figure 4E:
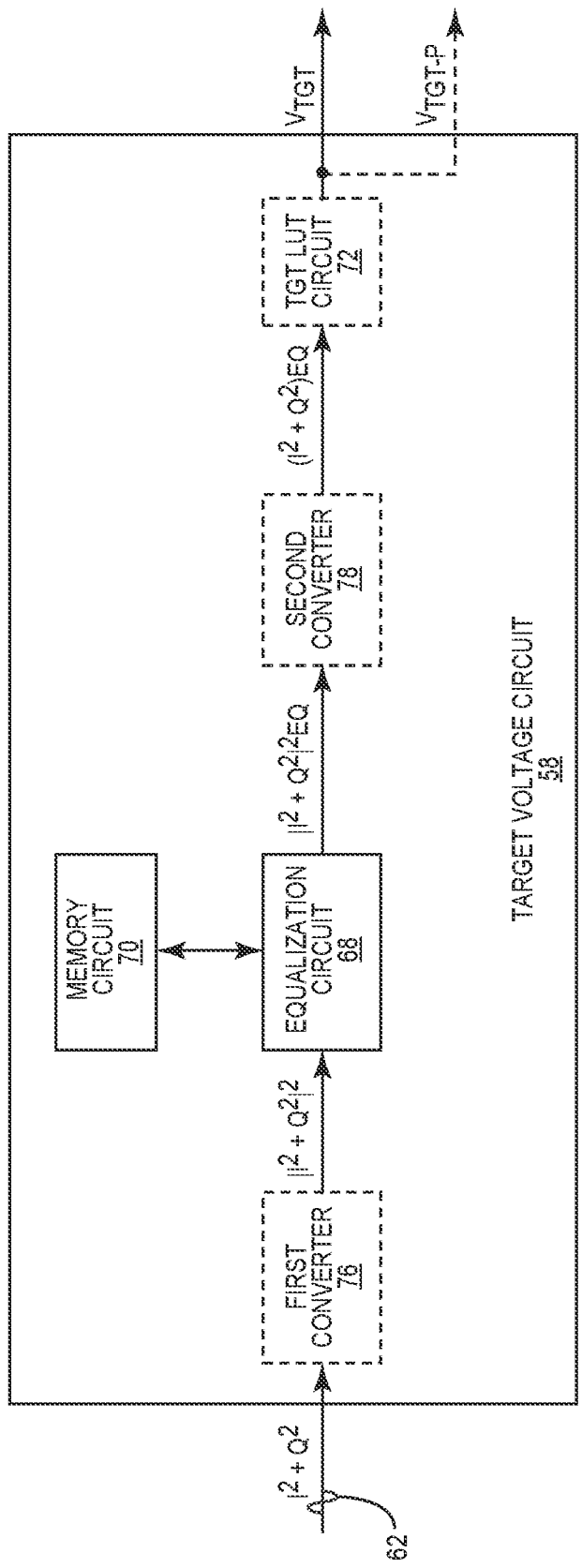

FIG. 4E is a schematic diagram of the target voltage circuit 58 configured according to another embodiment of the present disclosure. In this embodiment, the target voltage circuit 58 further includes a first converter 76 and a second converter 78. The first converter 76 receives the time-variant amplitude $I^2+Q^2$ in the indication signal 62 and converts the time-variant amplitude $I^2+Q^2$ into a squared time-variant amplitude $|I^2+Q^2|^2$. The equalization circuit 68 applies the real equalization filter HRAFTe(t) to the squared time-variant amplitude $|I^2+Q^2|^2$ to generate a squared equalized time-variant amplitude $|I^2+Q^2|^2_{EQ}$. The second converter 78 performs a square root operation on the squared equalized time-variant amplitude $|I^2+Q^2|^2_{EQ}$ to generate the equalized time-variant amplitude $(I^2+Q^2)_{EQ}$.

Figure 4F:
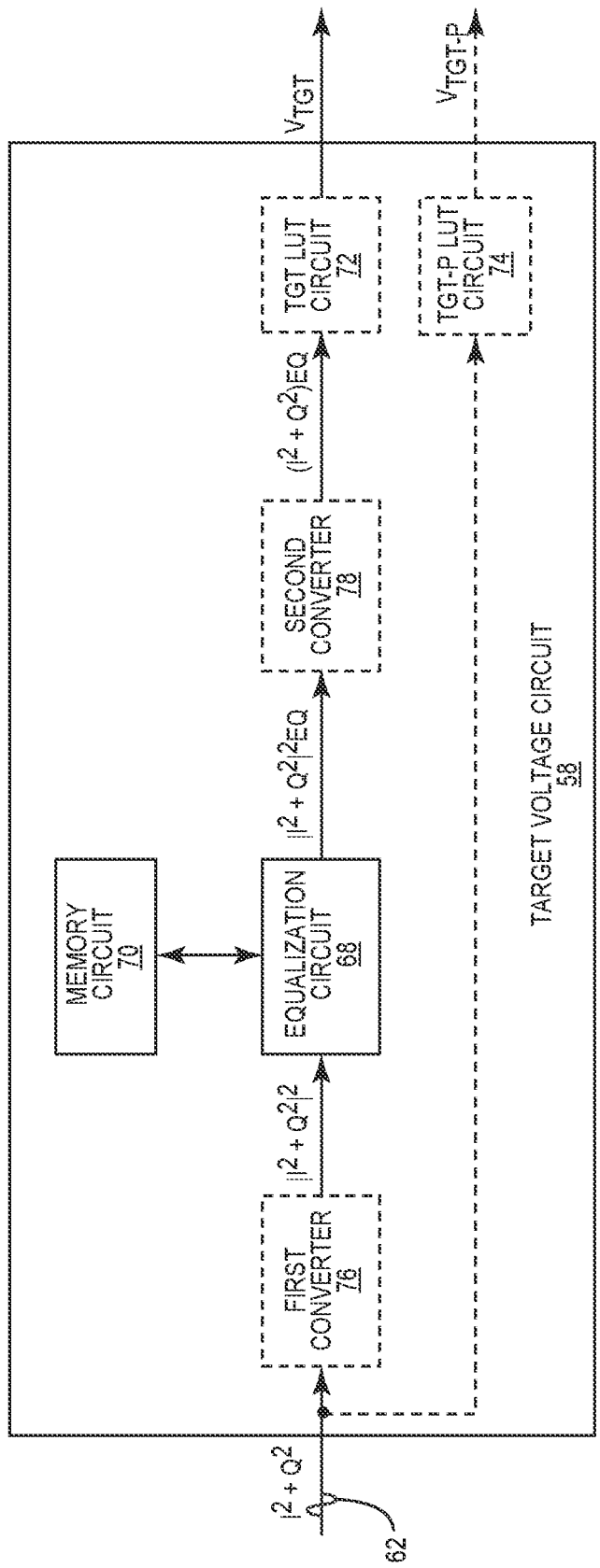

FIG. 4F is a schematic diagram of the target voltage circuit 58 configured according to another embodiment of the present disclosure. Herein, the phase correction voltage LUT 74 is configured to generate the modulated phase correction target voltage $V_{TGT-P}$ based on the time-variant amplitude $I^2+Q_2$.

With reference back to FIG. 3, the equalization circuit 68 in the target voltage circuit 58 can be configured to determine the real equalization filter HRAFTe(t) in accordance with the equation below.

$$\text{HRAFTe}(t)/f_{scape} = [1-|\text{Hifwd}(s)-1|-(1-|\text{conv}(T_{PA}(s)*\text{Hifwd}(s))-1|]+[1-|\text{Hirev}(s)-1|-(1-|\text{conv}(T_{PA}(s)*\text{Hirev}(s)-1|]$$

$$\text{Hifwd}(s) = 1/[1-T_{PA}(s)*T_f(s)]$$

$$\text{Hirev}(s) = T_f(s)/[1-T_{PA}(s)*T_f(s)]$$

In the equation above, $f_{scale}$ represents a scaling factor. $T_{PA}(s)$ represents a reflection coefficient and $T_f(s)$ represents a reflection coefficient, as previously illustrated in FIG. 2.

Figure 5A:
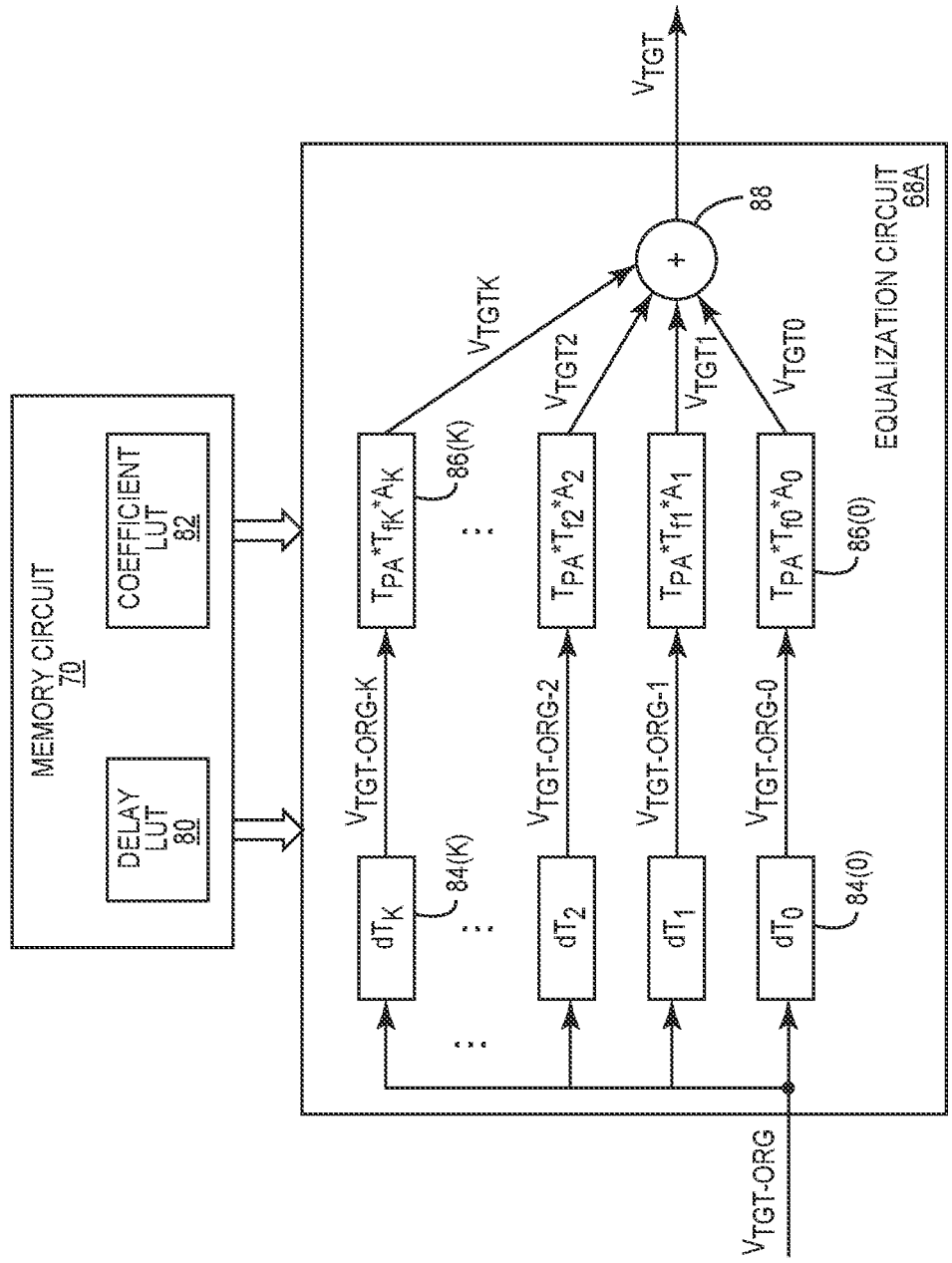
FIGS. 5A-5B are schematic diagrams providing exemplary illustrations of an equalization circuit in the target voltage circuit of FIGS. 4A-4E.
Figure 5B:
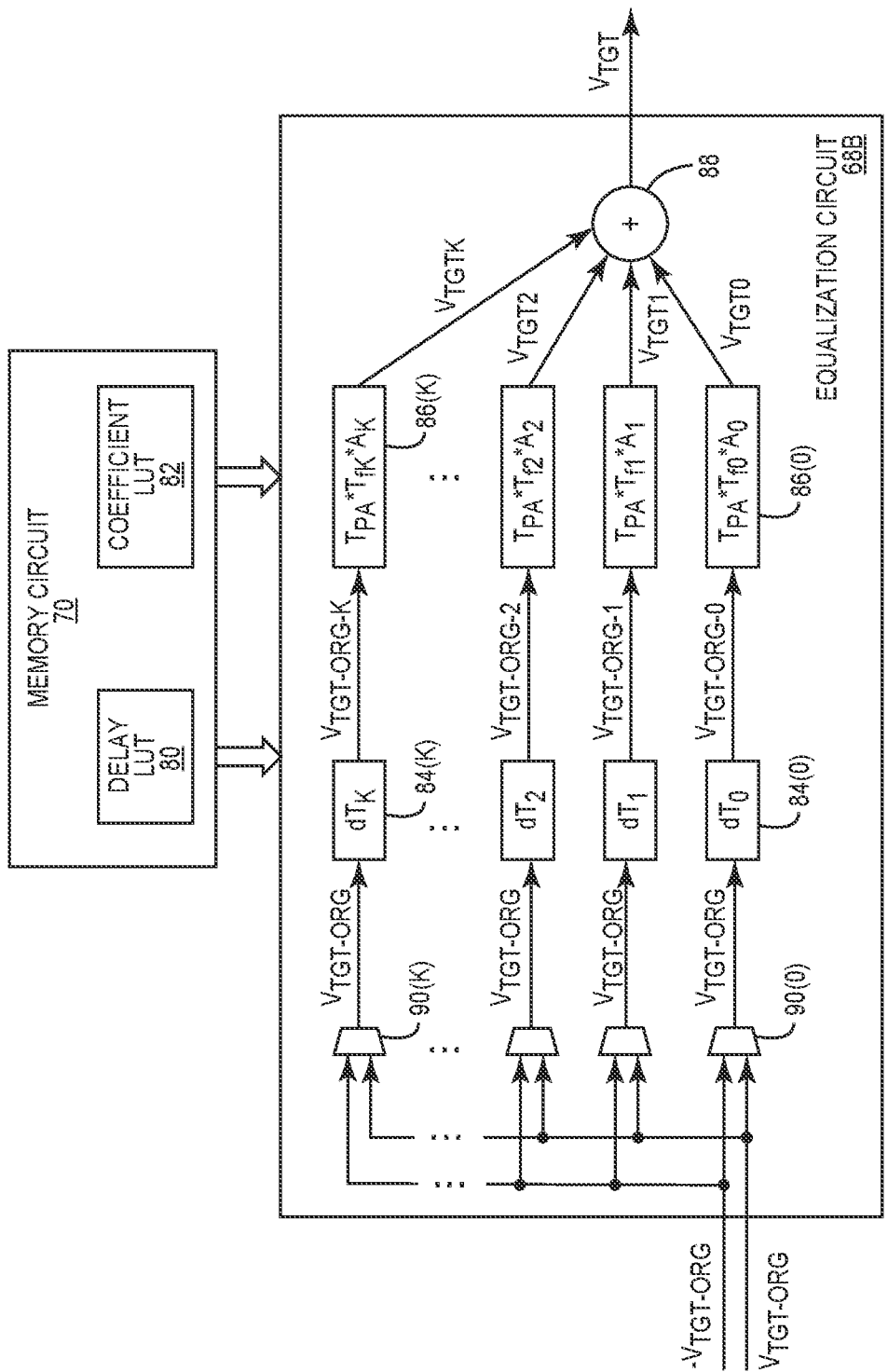

The equalization circuit 68 in FIGS. 4A and 4B can be implemented based on any of the embodiments described in FIGS. 5A and 5B. Common elements between FIGS. 4A, 4B, 5A, and 5B are shown therein with common element numbers and will not be re-described herein.

FIG. 5A is a schematic diagram of an exemplary equalization circuit 68A configured according to an embodiment of the present disclosure. In this embodiment, the memory circuit 70 is configured to store a delay LUT 80 and a coefficient LUT 82. The delay LUT 80 is configured to store multiple delay factors $dT_0$-$dT_K$. Each of the delay factors $dT_0$-$dT_K$ corresponds to a respective one of multiple sampled impulse responses of the complex voltage distortion filter $H_{IV}(s)$. The coefficient LUT 82 is configured to store multiple impulse response coefficients $T_{PA}*T_{fj}*A_j$ ($0 \le j \le K$) each corresponding to a respective one of the delay factors.

The equalization circuit 68A includes multiple delay circuits 84(0)-84(K). Each of the delay circuits 84(0)-84(K) is configured to delay the initial modulated target voltage $V_{TGT-ORG}$ by a respective one of the delay factors $dT_0$-$dT_K$ to generate a respective one of multiple delayed target voltages $V_{TGT-ORG-j}$ ($0 \le j \le K$). The equalization circuit 68A also includes multiple equalizer circuits 86(0)-86(K). Each of the equalizer circuits 86(0)-86(K) is configured to equalize a respective one of the delayed target voltages $V_{TGT-ORG-j}$ ($0 \le j \le K$) based on a respective one of the impulse response coefficients $T_{PA}*T_{fj}*A_j$ ($0 \le j \le K$) to generate a respective one of multiple equalized target voltages $V_{TGT0}$-$V_{TGTK}$. The equalization circuit 68A further includes a summing circuit 88 to sum up the equalized target voltages $V_{TGT0}$-$V_{TGTK}$ to generate the modulated target voltage $V_{TGT}$.

Notably, the initial modulated target voltage $V_{TGT-ORG}$ can be provided in the form of a differential initial modulated target voltage $\pm V_{TGT-ORG}$. In this regard, FIG. 5B is a schematic diagram of an exemplary equalization circuit 68B configured according to an embodiment of the present disclosure.

In this embodiment, the equalization circuit 68B further includes multiplexers 90(0)-90(K). Each of the multiplexers 90(0)-90(K) is coupled to a respective one of the delay circuits 84(0)-84(K). Specifically, each of the multiplexers 90(0)-90(K) is configured to convert a negative initial modulated target voltage $-V_{TGT-ORG}$ into a positive initial modulated target voltage $+V_{TGT-ORG}$ and provide the positive initial modulated target voltage $+V_{TGT-ORG}$ to each of the delay circuits 84(0)-84(K) as the initial modulated target voltage $V_{TGT-ORG}$.

Those skilled in the art will recognize improvements and modifications to the preferred embodiments of the present disclosure. All such improvements and modifications are considered within the scope of the concepts disclosed herein and the claims that follow.

What is claimed is:

1. A wideband transmission circuit comprising:
a power amplifier circuit coupled to a transmitter circuit via a radio frequency (RF) front-end circuit and configured to amplify an RF signal based on a modulated voltage and provide the amplified RF signal to the RF front-end circuit; and
an envelope tracking (ET) integrated circuit (ETIC) comprising:
a voltage modulation circuit configured to generate the modulated voltage based on a modulated target voltage; and
a target voltage circuit configured to cause the modulated target voltage to be equalized by a real equalization filter to compensate for a complex voltage distortion filter created on an output stage of the power amplifier circuit by an interaction between an output reflection coefficient of the power amplifier circuit and an input reflection of the RF front-end circuit.

2. The wideband transmission circuit of claim 1, further comprising a transceiver circuit configured to:
generate the RF signal associated with a time-variant power envelope and provide the RF signal to the power amplifier circuit;
sample the time-variant power envelope to detect a time-variant amplitude of the RF signal; and
generate an initial modulated target voltage based on the time-variant amplitude of the RF signal and provide the initial modulated target voltage to the target voltage circuit.

3. The wideband transmission circuit of claim 2, wherein the target voltage circuit comprises an equalization circuit configured to apply the real equalization filter to the initial modulated target voltage to generate the modulated target voltage.

4. The wideband transmission circuit of claim 3, wherein the target voltage circuit further comprises a memory circuit configured to store:
a delay lookup table (LUT) configured to store a plurality of delay factors each corresponding to a respective one of a plurality of sampled impulse responses of the complex voltage distortion filter; and
a coefficient LUT configured to store a plurality of impulse response coefficients each corresponding to a respective one of the plurality of delay factors.

5. The wideband transmission circuit of claim 4, wherein the equalization circuit comprises:
a plurality of delay circuits each configured to delay the initial modulated target voltage by a respective one of the plurality of delay factors to generate a respective one of a plurality of delayed target voltages;
a plurality of equalizer circuits each configured to equalize a respective one of the plurality of delayed target voltages based on a respective one of the plurality of impulse response coefficients to generate a respective one of a plurality of equalized target voltages; and
a summing circuit configured to sum up the plurality of equalized target voltages to generate the modulated target voltage.

6. The wideband transmission circuit of claim 5, wherein the equalization circuit further comprises a plurality of multiplexers each coupled to a respective one of the plurality of delay circuits and configured to:
convert a negative initial modulated target voltage into a positive initial modulated target voltage; and
provide the positive initial modulated target voltage to each of the plurality of delay circuits as the initial modulated target voltage.

7. The wideband transmission circuit of claim 2, wherein the ETIC further comprises a phase correction circuit configured to generate a phase correction voltage based on a modulated phase correction target voltage.

8. The wideband transmission circuit of claim 7, wherein the target voltage circuit is further configured to provide the initial modulated target voltage to the phase correction circuit as the modulated phase correction target voltage.

9. The wideband transmission circuit of claim 7, wherein the target voltage circuit is further configured to provide the modulated target voltage to the phase correction circuit as the modulated phase correction target voltage.

10. The wideband transmission circuit of claim 1, further comprising a transceiver circuit configured to:
generate the RF signal associated with a time-variant power envelope and provide the RF signal to the power amplifier circuit;
sample the time-variant power envelope to detect a time-variant amplitude of the RF signal; and
provide the time-variant amplitude to the target voltage circuit.

11. The wideband transmission circuit of claim 10, wherein the target voltage circuit comprises:
an equalization circuit configured to apply the real equalization filter to the time-variant amplitude to generate an equalized time-variant amplitude; and
a target voltage lookup table (LUT) circuit configured to generate the modulated target voltage based on the equalized time-variant amplitude.

12. The wideband transmission circuit of claim 11, wherein the ETIC further comprises a phase correction circuit configured to generate a phase correction voltage based on a modulated phase correction target voltage.

13. The wideband transmission circuit of claim 12, wherein the target voltage circuit is further configured to provide the modulated target voltage to the phase correction circuit as the modulated phase correction target voltage.

14. The wideband transmission circuit of claim 12, wherein the target voltage circuit further comprises a phase correction voltage LUT configured to generate the modulated phase correction target voltage based on the time-variant amplitude.

15. The wideband transmission circuit of claim 10, wherein the target voltage circuit comprises:
a first converter configured to convert the time-variant amplitude into a squared time-variant amplitude;
an equalization circuit configured to apply the real equalization filter to the squared time-variant amplitude to generate a squared equalized time-variant amplitude;
a second converter configured to perform a square root operation on the squared equalized time-variant amplitude to generate the time-variant amplitude; and
a target voltage lookup table (LUT) circuit configured to generate the modulated target voltage based on the equalized time-variant amplitude.

16. The wideband transmission circuit of claim 15, wherein the ETIC further comprises a phase correction circuit configured to generate a phase correction voltage based on a modulated phase correction target voltage.

17. The wideband transmission circuit of claim 16, wherein the target voltage circuit is further configured to provide the modulated target voltage to the phase correction circuit as the modulated phase correction target voltage.

18. The wideband transmission circuit of claim 16, wherein the target voltage circuit further comprises a phase correction voltage LUT configured to generate the modulated phase correction target voltage based on the time-variant amplitude.

\* \* \* \* \*